US009864954B1

(12) United States Patent
Jasionowski

(10) Patent No.: US 9,864,954 B1
(45) Date of Patent: *Jan. 9, 2018

(54) OPTIMIZED TESTING OF A PARTIALLY SYMMETRIC QUANTUM-LOGIC CIRCUIT

(71) Applicant: International Business Machines Corporation, Armonk, NY (US)

(72) Inventor: Pawel Jasionowski, Wroclaw (PL)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/434,867

(22) Filed: Feb. 16, 2017

Related U.S. Application Data

(63) Continuation of application No. 15/194,718, filed on Jun. 28, 2016, now Pat. No. 9,665,829.

(51) Int. Cl.
*H03K 19/195* (2006.01)
*G06N 99/00* (2010.01)

(52) U.S. Cl.
CPC ........ *G06N 99/002* (2013.01); *H03K 19/195* (2013.01)

(58) Field of Classification Search
None
See application file for complete search history.

(56) References Cited

U.S. PATENT DOCUMENTS 8,972,237 B2   3/2015   Wecker

2006/0056631 A1   3/2006   Beausoleil et al.
2012/0117114 A1*  5/2012   Goranson ............... G06N 5/00
                                                          707/776
2015/0339417 A1  11/2015   Garcia-Ramirez et al.

FOREIGN PATENT DOCUMENTS

JP   2014203182   10/2014
JP   5700827      2/2015

OTHER PUBLICATIONS

Maslov et al., Quantum Circuit Simplification and Level Compaction, arXiv:quant-ph10604001v2, Feb. 27, 2008, 13 pages.
Notice of Allowance (Jan. 11, 2017) for U.S. Appl. No. 15/194,718, filed Jun. 28, 2016.
312 Amendment (Feb. 6, 2017) for U.S. Appl. No. 15/194,718, filed Jun. 28, 2016.

* cited by examiner

*Primary Examiner* — Anh Tran
(74) *Attorney, Agent, or Firm* — Schmeiser, Olsen & Watts, LLP; John Pivnichny

(57) ABSTRACT

A method and associated systems for using wreath products and invariance groups to test a partially symmetric quantum-logic circuits. A test system receives information that describes the architecture of a quantum-logic circuit to be tested. The system uses this information to hierarchically organize the circuit's inputs into non-overlapping blocks. The system creates set of groups associated with the blocks, and then generates an invariance group that contains one or more invariant permutations of the inputs by computing a wreath product of the set of groups. These invariant permutations identify a minimal number of tests required to verify the circuit for all possible input vectors. The system then directs a test apparatus to perform the resulting optimized test sequence upon the circuit.

20 Claims, 2 Drawing Sheets

OPTIMIZED TESTING OF A PARTIALLY SYMMETRIC QUANTUM-LOGIC CIRCUIT

This application is a continuation application claiming priority to Ser. No. 15/194,718, filed Jun. 28, 2016.

TECHNICAL FIELD

The present invention relates to testing quantum-logic circuits (also known as "q-modules") and in particular to using group theory and wreath-product computations in order to optimize testing of partially symmetric q-modules.

BACKGROUND

Unlike conventional binary logic, quantum logic is not limited to binary states of 0 and 1. Because inputs and outputs of a quantum-logic circuit may assume far more states than those of an analogous binary-logic circuit, a far greater number of tests may be required to fully verify correct operation of the quantum-logic circuit. Testing a q-module comprising larger numbers of inputs and states can therefore be prohibitively expensive or resource-intensive.

BRIEF SUMMARY

A first embodiment of the present invention provides a quantum-logic test-development system comprising a processor, a memory coupled to the processor, and a computer-readable hardware storage device coupled to the processor, the storage device containing program code configured to be run by the processor via the memory to implement a method for optimizing testing of a partially symmetric quantum-logic circuit by using wreath products and invariance groups, the method comprising:

the system receiving architectural information about a quantum-logic circuit that has at least eight inputs and at least one output, where the quantum-logic circuit performs operations capable of being represented by a function f( );

the system, as a function of the architectural information, evenly dividing all the at least eight inputs into at least four non-intersecting first-level blocks, where every first-level block contains a same number of inputs;

the system, as a function of the architectural information, evenly partitioning all the at least four first-level blocks into at least two non-intersecting second-level blocks, where every second-level block contains a same number of first-level blocks;

the system creating a first-level group G1 that comprises a set of first-level indices and a set of one or more first-level permutation operations capable of being performed upon the set of first-level indices, where a number of the set of first-level indices equals the number of inputs in each first-level block;

the system defining a second-level group G2 that comprises a set of second-level indices and a set of one or more second-level permutation operations capable of being performed upon the set of second-level indices, where a number of the set of second-level indices equals the number of first-level blocks in each second-level block; and the system generating a first wreath product G1 ≀ G2 as a function of the evenly dividing and the evenly partitioning, where ≀ is an unrestricted wreath-product operator, and where the first wreath product represents a first invariance group of the function f( ).

A second embodiment of the present invention provides method for optimizing testing of a partially symmetric quantum-logic circuit by using wreath products and invariance groups, the method comprising:

receiving architectural information about a quantum-logic circuit that has at least eight inputs and at least one output, where the quantum-logic circuit performs operations capable of being represented by a function f( );

evenly dividing, as a function of the architectural information, all the at least eight inputs into at least four non-intersecting first-level blocks, where every first-level block contains a same number of inputs;

evenly partitioning, as a function of the architectural information, all the at least four first-level blocks into at least two non-intersecting second-level blocks, where every second-level block contains a same number of first-level blocks;

creating a first-level group G1 that comprises a set of first-level indices and a set of one or more first-level permutation operations capable of being performed upon the set of first-level indices, where a number of the set of first-level indices equals the number of inputs in each first-level block;

defining a second-level group G2 that comprises a set of second-level indices and a set of one or more second-level permutation operations capable of being performed upon the set of second-level indices, where a number of the set of second-level indices equals the number of first-level blocks in each second-level block; and generating a first wreath product G1 ≀ G2 as a function of the evenly dividing and the evenly partitioning, where ≀ is an unrestricted wreath-product operator, and where the first wreath product represents a first invariance group of the function f( ).

A third embodiment of the present invention provides a computer program product, comprising a computer-readable hardware storage device having a computer-readable program code stored therein, the program code configured to be executed by a quantum-logic test-development system comprising a processor, a memory coupled to the processor, and a computer-readable hardware storage device coupled to the processor, the storage device containing program code configured to be run by the processor via the memory to implement a method for optimizing testing of a partially symmetric quantum-logic circuit by using wreath products and invariance groups, the method comprising:

the system receiving architectural information about a quantum-logic circuit that has at least eight inputs and at least one output, where the quantum-logic circuit performs operations capable of being represented by a function f( );

the system, as a function of the architectural information, evenly dividing all the at least eight inputs into at least four non-intersecting first-level blocks, where every first-level block contains a same number of inputs;

the system, as a function of the architectural information, evenly partitioning all the at least four first-level blocks into at least two non-intersecting second-level blocks, where every second-level block contains a same number of first-level blocks;

the system creating a first-level group G1 that comprises a set of first-level indices and a set of one or more first-level permutation operations capable of being performed upon the set of first-level indices, where a number of the set of first-level indices equals the number of inputs in each first-level block;

the system defining a second-level group G2 that comprises a set of second-level indices and a set of one or more second-level permutation operations capable of being performed upon the set of second-level indices, where a number of the set of second-level indices equals the number of first-level blocks in each second-level block; and the system generating a first wreath product G1 ≀ G2 as a function of the evenly dividing and the evenly partitioning, where ≀ is an unrestricted wreath-product operator, and where the first wreath product is a first invariance group of the function f( ), where the first wreath product equals the group $((G1_1 \times \ldots G1_m) \times H, X \times Y)$, where × is a Cartesian product operator, where m=the number of first-level blocks contained in each second-level block, where each group $G_1 \ldots G_m$ is an identical copy of the set of first-level indices, where H=the set of second-level indices, where X=the set of first-level permutation operations, and where Y=the set of second-level permutation operations.

DETAILED DESCRIPTION

Figure 1:
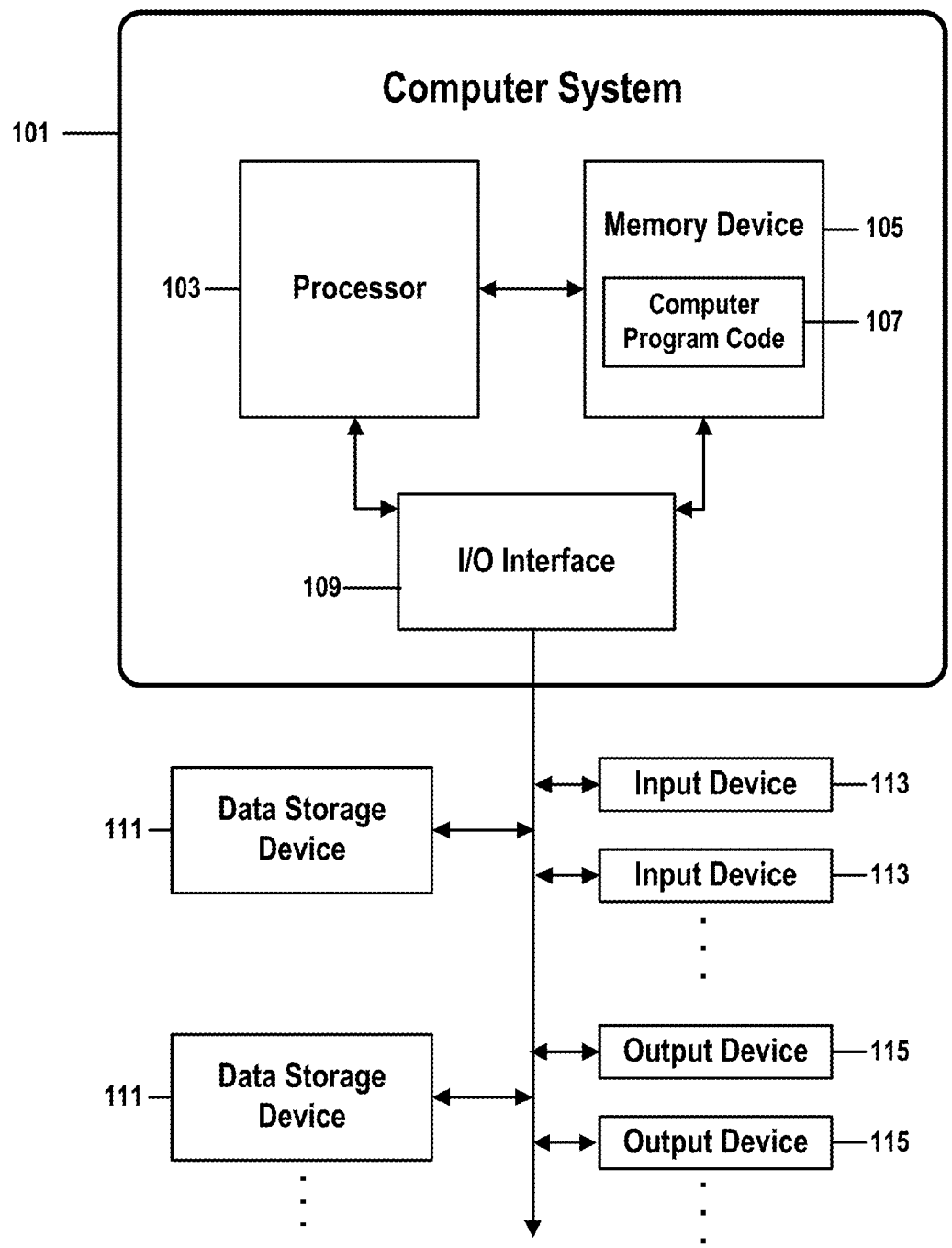
FIG. 1 shows the structure of a computer system and computer program code that may be used to implement a method for optimizing testing of a partially symmetric quantum-logic circuit by using wreath products and invariance groups in accordance with embodiments of the present invention.

Embodiments of the present invention optimize the operation of a test system or test application that verifies correct operation of a partially symmetric quantum-logic circuit.

Testing a quantum-logic circuit (or "q-module") can be far more time-consuming and resource-intensive than testing conventional binary logic circuits because quantum logic is not limited to two states. Where verifying operation of a two-input binary AND circuit would require four tests, corresponding to four possible binary inputs {00, 01, 10, and 11}, a two-input q-module that supports four states A, B, C, and D, would require 16 tests to test 16 possible input states {AA, AB, AC, AD, BA, BB, BC, BD, CA, CB, CC, CD, DA, DB, DC, and DD}. Embodiments of the present invention solve this technical problem by enhancing the operation of a circuit-testing software application or a hardware circuit-testing device.

The number of necessary tests needed to verify a q-module increases as a geometric function of the circuit's number of states or number of inputs. In general, a circuit with n inputs and t states (t>1) would require $t^n$ tests in order to verify each possible set of input values. An n-input binary-logic circuit that supports only values of 0 and 1 would thus require only $2^n$ tests.

In general, permuting any inputs of an input vector $\underline{x}$ by performing or applying a permutation σ to $\underline{x}$ causes the module's output to change. Consider, for example, a 3-input, 1-output q-module that receives a three-input input vector $\underline{x}=(x_1, x_2, x_3)$. Each of these three inputs can be in any of four states {A,B,C,D} and the module's single output can be in any of three states {E,F,G}. The three inputs may be ordered in any of six distinct ways: $(x_1, x_2, x_3)$, $(x_1, x_3, x_2)$, $(x_2, x_1, x_3)$, $(x_2, x_3, x_1)$, $(x_3, x_1, x_2)$, and $(x_3, x_2, x_1)$, each of which may be generated by performing one of six possible permutations (including the trivial identity permutation (id), which does not change the order of indices) upon an original vector $\underline{x}=(x_1, x_2, x_3)$. If, for example, inputs $x_1$, $x_2$, and $x_3$ are initially in states (A, B, C), performing a permutation (2,3) upon the input vector would permute the order of the last two of the three inputs, thus permuting the input to (A, C, B). Such a permutation in general causes the q-module's output to change.

A characteristic of some q-modules, however, is that certain permutations of the module's inputs never produce a change to the module's output state, regardless of the states of each input prior to permutation. If this is true of all possible permutations of all inputs, the circuit is said to be symmetrical. If it is true of only a proper blocks of all possible permutations of inputs, the circuit is said to be partially symmetrical. Note that nearly all q-modules are symmetric with respect to an identity permutation (id), which may consist of a permutation of 0 inputs. The identity permutation may be mentioned in examples and embodiments described in this document, but it should be considered a trivial case within the context of the present invention.

This document will represent a permutation of an input vector $\underline{x}$ as an ordered set of indices that each identify a position of an element of $\underline{x}$. Care should be taken not to confuse this notation with that normally used to represent other types of vectors or ordered sets.

Using these notation conventions, a permutation of an input vector $\underline{x}=(x_1, x_2, x_3)$ to $(x_3, x_2, x_1)$ (a permutation of inputs $x_1$ and $x_3$, which exchanges inputs associated with indices 1 and 3 of vector $\underline{x}$) would be represented as an ordered pair of indices (1,3) (the indices of inputs $x_1$ and $x_3$).

Because permutation theory is known in the art, this document will provide only a brief overview that may help readers understand the notation used herein. Applying a permutation σ=(a,b,c,d) to a four-element vector $\underline{x}=(x_1,x_2,x_3,x_4)$ rearranges the elements of $\underline{x}$ to a permuted vector $\underline{xp}$. In this example, {a,b,c,d} each represent in index of an element of $\underline{x}$, and because $\underline{x}$ has four elements, these indices can each assume a value of 1 through 4.

A permutation is evaluated one index at a time, and a first index identified by the permutation identifies a position in $\underline{xp}$ to which should be moved an element identified by the first index. A permutation is evaluated right-to-left in this manner, in circular fashion, throughout the ordered set of indices that represents the permutation. This procedure ends when continuing would create a repetition.

Consider, for example, permutation σ=(1,2). Here, the permutation is notated as an ordered pair of index 1 and index 2 of input vector $\underline{x}$. Applying σ to $\underline{x}=(x_1, x_2, x_3)$ performs the following procedure:

replace index #1 of $\underline{x}$ with $x_2$ (index #2 of $\underline{x}$)→$(x_2, x_2, x_3)$, replace index #2 of $\underline{x}$ with $x_1$ (index #1 of $\underline{x}$)→$(x_2, x_1, x_3)$, stop because rotating back to the first index of a would create a repetitive operation. σ($\underline{x}$) thus produces permuted vector $\underline{xp}$=(x2,x1,x3), which swaps x1 and x2 of $\underline{x}$.

In a second example, a permutation of an input vector $x=(x_1, x_2, x_3, x_4)$ to $(x_3, x_1, x_2, x_4)$ can be represented as (1,3,2). As above, σ($\underline{x}$) generates permuted vector $\underline{xp}$ by the following procedure:

replace index #1 of $\underline{x}$ with $x_3$ (index #3 of $\underline{x}$)→$(x_3, x_2, x_3, x_4)$, replace index #3 of $\underline{x}$ with $x_2$ (index #2 of $\underline{x}$)→$(x_3, x_2, x_2, x_4)$, replace index #2 of $\underline{x}$ with $x_2$ (index #1 of $\underline{x}$)→$(x_3, x_1, x_2, x_4)$, and stop because rotating back to the first index of a would repeat a previously performed operation.

In a more complex example, permutation σ=(1,3,2,4) permutes input vector
$\underline{x}=(x_1, x_2, x_3, x_4)$ into vector
$\underline{xp}=(x_3, x_4, x_2, x_1)$. As before, $\sigma(\underline{x})$ generates $\underline{xp}$ by the following procedure:
  replace index #1 of $\underline{x}$ with $x_3$ (index #3 of $\underline{x}$)→$(x_3, x_2, x_3, x_4)$,
  replace index #3 of $\underline{x}$ with $x_2$ (index #2 of $\underline{x}$)→$(x_3, x_2, x_2, x_4)$,
  replace index #2 of $\underline{x}$ with $x_4$ (index #4 of $\underline{x}$)→$(x_3, x_4, x_2, x_4)$,
  replace index #4 of $\underline{x}$ with $x_1$ (index #1 of $\underline{x}$)→$(x_3, x_4, x_2, x_1)$,
  stop because rotating back to the first index of a would repeat a previously performed operation.

Expressed more formally, for any input vector $(\underline{x})=(x_1, x_2, x_3, x_4)$, the permutation of the indices of $\underline{x}\sigma(\underline{x})$=permuted vector $\underline{xp}=(x_{\sigma(1)}, x_{\sigma(2)}, x_{\sigma(3)}, x_{\sigma(4)})$. Here, if σ=(1,3,2,4), then $\sigma(\underline{x})$ transforms index 1 into 3, 3 into 2, 2 into 4 and 4 into 1. Therefore, σ(1)=3, σ(2)=4, σ(3)=2, σ(4)=1, and $xp=(x_{\sigma(1)}, x_{\sigma(2)}, x_{\sigma(3)}, x_{\sigma(4)})=(x_3, x_4, x_2, x_1)$.

In another variation, a permutation may be represented as two or more ordered pairs, each of which is evaluated independently. For example, performing permutation σ(x)=(1,3)(2,4) upon vector $\underline{x}=(x_1, x_2, x_3, x_4)$ to produce output $\underline{xp}=(x_3, x_4, x_1, x_2)$ can be evaluated in two steps:

(1,3):
  replace index #1 of $\underline{x}$ with $x_3$ (index #3 of $\underline{x}$)→$(x_3, x_2, x_3, x_4)$,
  replace index #3 of $\underline{x}$ with $x_1$ (index #1 of $\underline{x}$)→$(x_3, x_2, x_1, x_4)$,
  stop because rotating back to the first index of σ would create a repetitive operation. $\sigma(\underline{x})$ thus produces permuted vector $\underline{xp}$=(x2,x1,x3), which swaps x1 and x2 of $\underline{x}$.

(2,4):
  replace index #2 of $\underline{x}$ with $x_4$ (index #4 of $\underline{x}$)→$(x_3, x_4, x_1, x_4)$,
  replace index #4 of $\underline{x}$ with $x_2$ (index #2 of $\underline{x}$)→$(x_3, x_4, x_1, x_2)$,
  stop because rotating back to the first index of σ would repeat a previously performed operation.

This permutation thus swaps a first division of $\underline{x}$(x1,x2) with a second division of $\underline{x}$ (x3,x4) without permuting the internal order of inputs comprised by either division.

A set of "symmetric" permutations may be referred to as an invariance group. If the previously described 3-input, 1-output, 4-state quantum circuit produces output E in response to receiving an input vector $\underline{x}=(x_1, x_2, x_3)$, applying any permutation of an invariance group associated with that circuit will not change the output. For example, if a permutation σ=(2,3) is a symmetric permutation (comprised by an invariance group of the q-module), a permuted input vector $\sigma(\underline{x})=(x_1, x_3, x_2)$ will not result in a change to the previous output E.

If a q-module is associated with a non-empty invariance group of symmetric permutations, the module is said to be symmetric and the invariance group is said to be a "Boolean function invariance group" or a "symmetry group" of a function f( ) that represents the q-module.

One property of an invariance group is that the permutations contained by the group are invariant regardless of the initial states of the permuted inputs. In the above example, the one-permutation invariance group {(2,3)} specifies that permuting the q-module's second and third inputs never changes the module's output. So, for example, regardless of whether the states of the module inputs change from (ABA) to (AAB), from (CCB) to (CBC), or from (CBA) to (CAB), the output of the q-module does not change.

Embodiments of the present invention employ this concept of invariance groups to greatly reduce the number of input vectors $\underline{x}$ that must be tested in order fully verify a q-module. Because applying an invariant permutation to a q-module's input vector $\underline{x}$ is known to leave the q-module's output unchanged, once that initial vector $\underline{x}$ has been tested, any other vector that may be generated by applying the invariant permutation to $\underline{x}$ is automatically deemed to have been verified. When an invariance group of a partially symmetric q-module comprises a significant number of permutations, embodiments of the present invention may dramatically reduce the number of tests required to fully verify the circuit.

FIG. 1 shows a structure of a computer system and computer program code that may be used to implement a method for optimizing testing of a partially symmetric quantum-logic circuit by using wreath products and invariance groups in accordance with embodiments of the present invention. FIG. 1 refers to objects 101-115.

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module," or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed upon the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In FIG. 1, computer system 101 comprises a processor 103 coupled through one or more I/O Interfaces 109 to one or more hardware data storage devices 111 and one or more I/O devices 113 and 115.

Hardware data storage devices 111 may include, but are not limited to, magnetic tape drives, fixed or removable hard disks, optical discs, storage-equipped mobile devices, and solid-state random-access or read-only storage devices. I/O devices may comprise, but are not limited to: input devices 113, such as keyboards, scanners, handheld telecommunications devices, touch-sensitive displays, tablets, biometric readers, joysticks, trackballs, or computer mice; and output devices 115, which may comprise, but are not limited to printers, plotters, tablets, mobile telephones, displays, or sound-producing devices. Data storage devices 111, input devices 113, and output devices 115 may be located either locally or at remote sites from which they are connected to I/O Interface 109 through a network interface.

Processor 103 may also be connected to one or more memory devices 105, which may include, but are not limited to, Dynamic RAM (DRAM), Static RAM (SRAM), Programmable Read-Only Memory (PROM), Field-Programmable Gate Arrays (FPGA), Secure Digital memory cards, SIM cards, or other types of memory devices.

At least one memory device 105 contains stored computer program code 107, which is a computer program that comprises computer-executable instructions. The stored computer program code includes a program that implements a method for optimizing testing of a partially symmetric quantum-logic circuit by using wreath products and invariance groups in accordance with embodiments of the present invention, and may implement other embodiments described in this specification, including the methods illustrated in FIGS. 1-2. The data storage devices 111 may store the computer program code 107. Computer program code 107 stored in the storage devices 111 is configured to be executed by processor 103 via the memory devices 105. Processor 103 executes the stored computer program code 107.

In some embodiments, rather than being stored and accessed from a hard drive, optical disc or other writeable, rewriteable, or removable hardware data-storage device 111, stored computer program code 107 may be stored on a static, nonremovable, read-only storage medium such as a Read-Only Memory (ROM) device 105, or may be accessed by processor 103 directly from such a static, nonremovable, read-only medium 105. Similarly, in some embodiments, stored computer program code 107 may be stored as computer-readable firmware 105, or may be accessed by processor 103 directly from such firmware 105, rather than from a more dynamic or removable hardware data-storage device 111, such as a hard drive or optical disc.

Thus the present invention discloses a process for supporting computer infrastructure, integrating, hosting, maintaining, and deploying computer-readable code into the computer system 101, wherein the code in combination with the computer system 101 is capable of performing a method for optimizing testing of a partially symmetric quantum-logic circuit by using wreath products and invariance groups.

Any of the components of the present invention could be created, integrated, hosted, maintained, deployed, managed, serviced, supported, etc. by a service provider who offers to facilitate a method for optimizing testing of a partially symmetric quantum-logic circuit by using wreath products and invariance groups. Thus the present invention discloses a process for deploying or integrating computing infrastructure, comprising integrating computer-readable code into the computer system 101, wherein the code in combination with the computer system 101 is capable of performing a method for optimizing testing of a partially symmetric quantum-logic circuit by using wreath products and invariance groups.

One or more data storage units 111 (or one or more additional memory devices not shown in FIG. 1) may be used as a computer-readable hardware storage device having a computer-readable program embodied therein and/or having other data stored therein, wherein the computer-readable program comprises stored computer program code 107. Generally, a computer program product (or, alternatively, an article of manufacture) of computer system 101 may comprise the computer-readable hardware storage device.

While it is understood that program code 107 for a method for optimizing testing of a partially symmetric quantum-logic circuit by using wreath products and invariance groups may be deployed by manually loading the program code 107 directly into client, server, and proxy computers (not shown) by loading the program code 107 into a computer-readable storage medium (e.g., computer data storage device 111), program code 107 may also be automatically or semi-automatically deployed into computer system 101 by sending program code 107 to a central server (e.g., computer system 101) or to a group of central servers. Program code 107 may then be downloaded into client computers (not shown) that will execute program code 107.

Alternatively, program code 107 may be sent directly to the client computer via e-mail. Program code 107 may then either be detached to a directory on the client computer or loaded into a directory on the client computer by an e-mail option that selects a program that detaches program code 107 into the directory.

Another alternative is to send program code 107 directly to a directory on the client computer hard drive. If proxy servers are configured, the process selects the proxy server code, determines on which computers to place the proxy servers' code, transmits the proxy server code, and then installs the proxy server code on the proxy computer. Program code 107 is then transmitted to the proxy server and stored on the proxy server.

In one embodiment, program code 107 for a method for optimizing testing of a partially symmetric quantum-logic circuit by using wreath products and invariance groups is integrated into a client, server and network environment by providing for program code 107 to coexist with software applications (not shown), operating systems (not shown) and network operating systems software (not shown) and then installing program code 107 on the clients and servers in the environment where program code 107 will function.

The first step of the aforementioned integration of code included in program code 107 is to identify any software on the clients and servers, including the network operating system (not shown), where program code 107 will be deployed that are required by program code 107 or that work in conjunction with program code 107. This identified software includes the network operating system, where the network operating system comprises software that enhances a basic operating system by adding networking features. Next, the software applications and version numbers are identified and compared to a list of software applications and correct version numbers that have been tested to work with program code 107. A software application that is missing or that does not match a correct version number is upgraded to the correct version.

A program instruction that passes parameters from program code 107 to a software application is checked to ensure that the instruction's parameter list matches a parameter list required by the program code 107. Conversely, a parameter passed by the software application to program code 107 is checked to ensure that the parameter matches a parameter required by program code 107. The client and server operating systems, including the network operating systems, are identified and compared to a list of operating systems, version numbers, and network software programs that have been tested to work with program code 107. An operating system, version number, or network software program that does not match an entry of the list of tested operating systems and version numbers is upgraded to the listed level on the client computers and upgraded to the listed level on the server computers.

After ensuring that the software, where program code 107 is to be deployed, is at a correct version level that has been tested to work with program code 107, the integration is completed by installing program code 107 on the clients and servers.

Embodiments of the present invention may be implemented as a method performed by a processor of a computer system, as a computer program product, as a computer system, or as a processor-performed process or service for supporting computer infrastructure.

Figure 2:
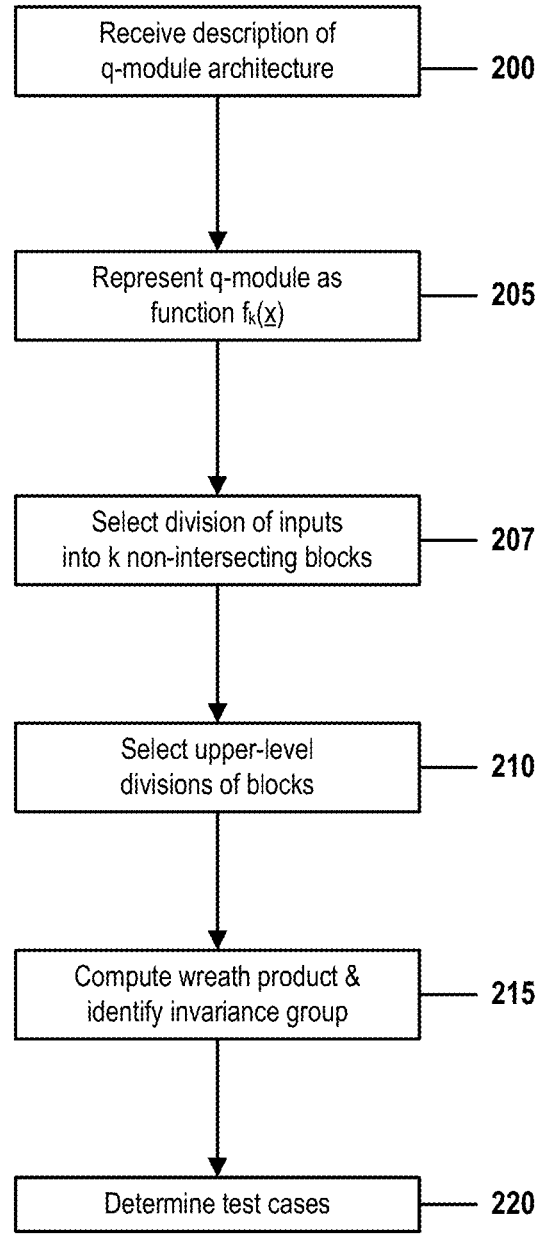
FIG. 2 is a flow chart that illustrates steps of a method for optimizing testing of a partially symmetric quantum-logic circuit by using wreath products and invariance groups in accordance with embodiments of the present invention.

FIG. 2 is a flow chart that illustrates steps of a method for optimizing testing of a partially symmetric quantum-logic circuit by using wreath products and invariance groups in accordance with embodiments of the present invention. FIG. 2 shows elements identified by reference numbers 200-220.

In step 200, a processor of a quantum-logic test-development system receives a description of a quantum-logic circuit, or "q-module" with n inputs $\{x_1 \ldots x_n\}$, each of which may assume any of t states, and one output that can assume any of s states. The operation performed by this q-module can be expressed as a function $f_k(\underline{x})$ that maps each n-element input vector $\underline{x}=(x_1, \ldots, x_n)$ onto one of the s output states.

In one example, a two-input, one-output quantum circuit device has two inputs $\{x_1, x_2\}$ that may each assume any of three states $\{0, 1, 2\}$. The circuit's output $f(\underline{x})$ may assume any of four states $\{0, 1, 2, 3\}$. In this example, n=2, t=4, and the set of all possible input vectors is $\{(00), (01), (02), (10), (11), (12), (20), (21), (22)\}$.

In another example, inputs $\{x_1, x_2, x_3\}$ of a 3-input, 1-output-state q-module with output that can assume any of s distinct states. The state of the three inputs are represented by an input vector $\underline{x}=(x_1, x_2, x_3)$ and the values (or states) assumed by each input comprised by this vector may be subject to permutations that include (id), (12), (13), (23), (123), or (312). As described above, the inputs of the q-module may be reordered by permutations into any of six possible distinct orders: $(x_1, x_2, x_3)$, $(x_1, x_3, x_2)$, $(x_2, x_1, x_3)$, $(x_2, x_3, x_1)$, $(x_3, x_1, x_2)$, and $(x_3, x_2, x_1)$.

If the operation of the q-module can be represented by a function $f(\underline{x})$ that maps each possible input vector $\underline{x}$ onto a corresponding value of s, one possible invariance group might contain a set of permutations $\{(1,2),(2,3)\}$, which respectively correspond to input permutations $(x_2, x_1, x_3)$ and $(x_1, x_3, x_2)$. Because these permutations are invariant, swapping either the first two inputs $\{x_1, x_2\}$ or the last two inputs $\{x_2, x_3\}$ will not change the output of the q-module. For example, an input (010) would produce the same output as would inputs (100) (permutation $(x_1, x_2)$) and (001) (permutation $(x_2, x_3)$).

Because $f(x_1, x_2, x_3)=f(x_2, x_1, x_3)=f(x_1, x_3, x_2)$ in this example, it is possible to simultaneously test three input vectors by testing only one of them.

In step 205, the system identifies a function $f(\underline{x})$ that represents the functionality performed by the q-module upon an n-tuple input vector $\underline{x}$ that represents an ordered set of n inputs of the q-module. The domain of function f consists of all inputs $\underline{x}=\{x_1, x_2, \ldots, x_n\}$ of the q-module, and the value of any $f(x_1, x_2, \ldots, x_n)$ is defined as an output state of q-module for input vector $x=(x_1, x_2, \ldots, x_n)$.

Expressed more formally, the operation generated by a quantum module M can be represented by function $f: \{0, 1, \ldots, t-1\}^n \rightarrow \{0, 1, \ldots, s-1\}$, and the value of $f(\underline{x})=f(x_1, x_2, \ldots, x_n)$ is the output produced by M in response to receiving input vector $\underline{x}=(x_1, x_2, \ldots, x_n)$. The set S(f) of all possible permutations of M's inputs that do not change the output of M is called an invariance group, or a symmetry group, of $f(\underline{x})$.

This may be stated as:
f: $\{0, 1, \ldots, t-1\}^n \rightarrow \{0, 1, \ldots, s-1\}$, where $t>1$, $s>1$.
$\sigma$ is a permutation comprised by symmetric group $S_n$, where $S_n$ contains permutations of indexes of input vector $\underline{x}=(x_1, x_2, \ldots, x_n)$.
The action of permutation $\sigma$ on $f(x_1, x_2, \ldots, x_n)$ may be expressed as:
$f^\sigma(x_1, x_2, \ldots, x_n)=f(x_{\sigma(1)}, x_{\sigma(2)}, \ldots, x_{\sigma(n)})$. That is, applying function $f^\sigma$ to an input
vector $\underline{x}$ is equivalent to applying function $f(\underline{x})$ to an input vector $\underline{x}^\sigma=\{x_{\sigma(1)}, x_{\sigma(2)}, \ldots, x_{\sigma(n)}\}$,
where $\underline{x}^\sigma=$ a permuted set of inputs created by applying permutation $\sigma$ to $\underline{x}$.
$S(f)=\{\sigma \in S_n : f=f^\sigma\}$. That is, S(f) is the set of all permutations $\sigma$ that, when performed upon an input vector $\underline{x}$, do not change the output value of f( ).
The set of permutations S(f) is thus defined as the invariance group, or symmetry group of f( ).

In step 207, the system divides the q-module's n inputs $\{x_1 \ldots x_n\}$ into k blocks by any means known in the art. This division may be performed as a function of the architecture of the q-module and, in many cases, a person skilled in the art may identify logical split points that divide the inputs by referring to product documentation published by the manufacturer of the q-module.

The examples described here refer to this set of k blocks as $\{A(i)\}$, $i=1, 2, \ldots k$. Each block contains the same number of inputs. That is, $|A(i)|=b$ for all $i=1 \ldots k$, where b=n/k (the total number of inputs divided by the number of blocks). In one example, the inputs of a 15-input q-module might be divided into five blocks, each of which contains any three ordered inputs. Two examples of such a five-block division are:

$A(1)=(x1,x2,x3), A(2)=(x4,x5,x6), \ldots A(5)=(x13,x14,x15)$ and $A(1)=(x4,x6,x7), A(2)=(x1,x2,x15), \ldots A(5)=(x12,x13,x14)$ Subsequent steps of FIG. 2 will generate an invariance group of permutations of inputs n=b*k, where that invariance group contain two types of permutations:

i) permutations that preserve the division of inputs into blocks $\{A(i)\}$ (permutations that permute only inputs that are in the same block A(i)); and ii) permutations that swap two or more blocks in their entirety, but do not permute the internal order of inputs within any of the swapped blocks. If, for example, $A(1)=\{x_1, x_2, x_3\}$ and $A(2)=\{x_4, x_5, x_6\}$, a permutation of this type might be (1,4)(2,5)(3,6), resulting in a permutation of input vector$(x_1, x_2, x_3, x_4, x_5, x_6)$ to $(x_4, x_5, x_6, x_1, x_2, x_3)$. Here, (1,4) exchanges inputs $x_1$ and $x_4$ (identified by the first and fourth indices), (2,5) exchanges inputs $x_2$ and $x_5$ (identified by the second and fifth indices), and (3,6) exchanges inputs $x_3$ and $x_6$ (identified by the third and sixth indices).

In step 210, the system in a similar manner organizes the k blocks $\{A(i)\}$ into a set of m second-level blocks $\{B(j)\}$, $j=1 \ldots m$. This division may be performed as a function of the architecture of the q-module and, in many cases, a person skilled in the art may identify logical split points that divide the inputs by referring to product documentation published by the manufacturer of the q-module.

For example, given a 12-input q-module with inputs $\{x_1 \ldots x_{12}\}$, $\{A(i)\}$ might consist of k=4 three-element first-level blocks=$(x_1, x_2, x_3) \ldots (x_{10}, x_{11}, x_{12})$, and $\{B(j)\}$ might consist of m=2 second-level blocks $B(1)=\{(A(1), A(2))\}$ and $B(2)=\{(A(3), A(4))\}$. Each of two second-level blocks B would thus contain two first-level blocks A, and each of four first level blocks A would contain three inputs x.

Higher-level divisions of inputs may continue subdividing blocks of inputs in this manner, creating a hierarchical structure, where each level of the structure contains blocks that each group two or more blocks at the next-highest level.

In step 215, the system identifies an invariance group of function f( ) as a wreath product of groups that each comprise one of the blocks identified in steps 207 and 210. Here, each group can be expressed as (G,X), where X is a set of data elements and G is a set of permutation operations that may be performed upon the data elements.

A wreath product is a specialized type of product that generates an output group as a function of two input groups. Although well-known in the art of group theory, this document will briefly overview the operation of a wreath product for reasons of readability, and because embodiments of the present invention apply and interpret wreath-product operations in an unusual way.

As will be described below, the system derives a wreath product of sets of groups that each represent the organization of data elements of one level of the hierarchical structure of step 210. This wreath product may be interpreted as invariance group S(f) of function $f_k(\ )$, where $f_k(\ )$ represents the operation of the q-module where the q-module's inputs have been divided into k first-level blocks $\{A(i)\}$.

This invariance group comprises permutations that may be performed upon an input vector $\underline{x}$ to produce a permuted vector $\underline{x}_p$, such that $f_k(\underline{x})$ and $f_k(\underline{x}_p)$ produce identical output. That is, for any possible combination of input states of a q-module, applying any permutation of S(f) to the inputs of the q-module does not change the output of the q-module.

In embodiments described in this document, the set S(f) of invariant permutations includes only permutations that either reorder inputs contained in only one block A(i), or else swap entire blocks. In some embodiments, an invariant permutation may perform both operations. No other invariant permutations may be derived from the particular type of wreath product described here. This wreath product is semi-recursive because it consists of nested wreath product computations. In examples and embodiments described in this document, a wreath product of two groups G and H will be expressed as $G \wr H$.

In one example, consider the set of divisions, similar to those shown in the above diagram, but where 24 inputs of a q-module have been divided into eight first-level blocks of three inputs, and where those eight first-level blocks have been divided into two second-level blocks. That is, n=12, k=8, b=3, m=3, and p=2.

Here, the total number of inputs n=b*m*p=3*4*2=(the number of inputs b in each first-level block A(i))*(the number m of first-level blocks A(i) in each second-level block B(i))*(the number p of second-level blocks).

Embodiments of the present invention then construct a first permutation group $\underline{G}$=(G(1), X) that comprises a set X of three data elements (that is, it comprises an ordered set of b indices, where b equals the number of inputs in any block A(i)); and a set of permutations G(1) that consists of all possible permutations that may be applied to the b=3 inputs of block A(i).

Similarly, the system constructs a second permutation group $\underline{H}$=(H(1), Y) that comprises a set Y of two data elements (that is, it comprises an ordered set of m indices, where m equals the number of blocks {A(i)} contained in any block B(j)); and a set of permutations H(1) that identifies all possible permutations that may be applied to the m=2 blocks A(i) of each block B(j).

Finally, the system constructs a third permutation group $\underline{L}$=(L, Z) that comprises a set Z of two data elements (that is, it comprises an ordered set of p indices, where p equals the number of blocks B(j)); and a set of permutations L(1) that identifies all possible permutations that may be applied to each of the m=2 blocks B(j).

In this example, the wreath product of G and H may be computed as:

$$\underline{G} \wr \underline{H} = ((G_1 \times \ldots G_m) \times H, X \times Y)$$

$$= ((G_1 \times G_2) \times H, X \times Y)$$

where × represents the Cartesian product operator, and each $G_i$, i=1 . . . m is an exact copy of G that operates upon a set of b=3 three inputs. One way to conceptualize this constructions is that the three inputs of $G_1$ correspond respectively to inputs $x_1$, $x_2$, $x_3$ and the three inputs of $G_2$ correspond respectively to inputs $x_4$, $x_5$, and $x_6$.

Similarly, the wreath product of $\underline{G} \wr \underline{H} \wr \underline{L}$ may be computed as:

$$\underline{G} \wr \underline{H} \wr \underline{L} = (\underline{G} \wr \underline{H}) \wr \underline{L} \equiv ((G_1 \times G_2) \times H) \wr L$$

$$= (((G_1 \times G_2) \times H_1) \times ((G_3 \times G_4) \times H_2) \times L, X \times Y \times Z)$$

$$= S(f)$$

As at the previous level, each group $(\underline{G} \wr \underline{H})(i) = ((G_1 \times G_2) \times H_i)$, i=1 . . . p is an exact copy of previous wreath product $\underline{G} \wr \underline{H}$. Each of these wreath products $\underline{G} \wr \underline{H}$ may be interpreted to correspond to one group of the p=2 blocks A(i). In this example, $(\underline{G} \wr \underline{H})(1)$ corresponds to blocks A(1) and A(2), and $(\underline{G} \wr \underline{H}(x_2)$ corresponds to block A(3) and A(4).

This wreath-product procedure can be extended to any number of levels of divisions by extrapolating the examples above. At each level of division, the invariance group is derived semi-recursively by computing a wreath product of two groups, one of which is the wreath product derived for the next-highest level. The final invariance group S(f) of any function $f(\underline{x})$ that represents functionality of a q-module, where the module's inputs are divided into z levels of blocks can be derived from Eq. (1):

$$S(f) = Grp_1 \wr Grp_2 \wr \ldots \wr Grp_z \quad (1)$$

where each Grp(i), i=1 . . . z corresponds to a level i and comprises a set of elements contained in each block at level i and a set of permutations that may be applied to that set of i-level elements.

In one example, an invariance group S(f) is defined as the set of permutations:

$$\{id,(1,2),(3,4),(1,2)(3,4),(1,3)(2,4),(1,4)(2,3),(1,4,2,3),\\(1,3,2,4)\} = \{id,(1,2)\} \wr \{id,(1,2)\}$$

In this example, $A^u_v$ represents a division of level u that corresponds to an index of a corresponding division at level u−1.

Eq. (1) generates the invariance group as a wreath product of two groups: $S(f) = G \wr H$, where both G and H={id, (1,2)}. Here, because G comprises a set of all permutations of set {1,2} (that is, m=2), the wreath product requires two identical copies of G, referred to here as $G_1$, which acts on set $A^1_1 = \{1,2\}$ and $G_2$, which acts on set $A^1_2 = \{3,4\}$. As in previous examples, each copy of G comprises permutations that act upon inputs comprised by one of the first-level divisions $A_i$ and permutations comprised by H each act on an entire first-level division (not individual inputs).

This example can be extended to embodiments that comprise three or more levels of divisions. As described above, G={id,(1,2)} and H={id,(1,2)}, so:

$$G \wr H = \{id,(1,2)\} \wr \{id,(1,2)\}$$

This computation may be extended to account for a third level of divisions when deriving invariance group by defining a third group L={id,(1,2)} and evaluation Eq. (1):

$$S(f) = G \wr H \wr L.$$

Here, group L acts upon on the set of indices of inputs {1,2,3,4,5,6,7,8}, in the following way: The first level of blocks comprise four blocks $$A^1_1 = \{x_1, x_2\}, A^1_2 = \{x_3, x_4\}, A^1_3 = \{x_5, x_6\}, A^1_4 = \{x_7, x_8\}$$

embodiments create four identical copies of group G denoted $G_1$, $G_2$, $G_3$, $G_4$. Each of these four groups contains the same two-index permutation comprised by the original group G, and each acts on one first-level two-input division of input vector $\underline{x}=\{x_1,x_2,x_3,x_4,x_5,x_6,x_7,x_8\}$. Therefore:

$G_1=\{id,(1,2)\}$ and acts on $A^1_1=\{x_1,x_2\}$,
$G_2=\{id,(3,4)\}$ and acts on $A^1_2=\{x_3,x_4\}$,
$G_3=\{id,(5,6)\}$ and acts on $A^1_3=\{x_5,x_6\}$, and
$G_4=\{id,(7,8)\}$ and acts on $A^1_4=\{x_7,x_8\}$.

A second level of this construction is represented in a similar manner by group H. Here, embodiments create two identical copies of group H, denoted $H_1$ and $H_2$. As before, $H_1=\{id,(1,2)\}$ and acts on $A^2_1=\{A^1_1, A^1_2\}$, and
$H_2=\{id,(3,4)\}$ and acts on $A^2_2=\{A^1_3,A_4\}$).

Finally third level of this construction is represented by the group $L=\{id,(1,2)\}$. Because there is only one set of divisions at the third-level only one copy of L is required, where:

$L_1=\{id,(1,2)\}$ and acts on $\{A^2_1, A^2_2\}$.

The result of this computation produces a total of $2^7=128$ distinct permutations.

In step 220, the system uses the functions and invariance group derived in step 215 as functions of the wreath products to streamline the testing of the q-module. This invariance group specifies a set of invariant or symmetrical permutations that, when performed upon the q-module's inputs, do not cause the q-module's output to change. And, as described above, a permutation that does not cause the output to change does not have to be tested, regardless of the state of any of the module's inputs prior to performing the permutation.

In a simple example, consider a four input q-module with inputs $\{x_1, x_2, x_3, x_4\}$ that is described by a function f( ). An invariance group S(f) for f has been identified by dividing the inputs into layers of blocks and by performing the semi-recursive wreath products described above. S(f) comprises an invariant permutation (1,2).

If a testing procedure has confirmed that the module produces correct output in response to receiving an input vector $\underline{x}=(1011)$, it is known that the module will produce the same output in response to receiving an input vector $x_p=(0111)$, where $x_p$ is created by performing the permutation (1,2) upon $\underline{x}$. Therefore, the q-module does not have be tested with input (0111) and the test case in which an input vector=(0111) can be eliminated.

Similarly, if a testing procedure has confirmed that the module produces correct output in response to receiving an input vector $\underline{x}=(0100)$, it is known that the module will produce the same output in response to receiving an input vector $x_p=(1000)$, where $x_p$ is created by performing the permutation (1,2) upon $\underline{x}$. Therefore, the q-module does not have be tested with input (1000) and the test case in which an input vector=(1000) can be eliminated.

In a more complex example, consider a q-module in which each input may assume either of two values (0, 1), where an invariance group S(f) has been identified by means of Eq. (1):

$$S(f)=\{(id),(1,2),(3,4),(1,2)(3,4),(1,3)(2,4),(1,4)(2,3),(1,4,2,3),(1,3,2,4)\}$$

This set of permutations is a wreath product of 2 groups. Permutations (1,2) and (3,4) each permute inputs at a first level, inside a block of length b=2. Permutations (1,2)(3,4), (1,3)(2,4), (1,4)(2,3), (1,4,2,3) and (1,3,2,4) each permute at a second level, permuting (or swapping) entire blocks $A_1=(1,2)$ and $A_2=(3,4)$. Permutations (1,4,2,3), (1,3,2,4) act on the second level as well.

For example, permutation (1,4,2,3) transforms $(x_1,x_2,x_3,x_4)$ into $(x_4,x_3,x_1,x_2)$ ($4\to1, 2\to4, 3\to2, 1\to3$), effectively swapping elements of the first block at the first level and swapping entire blocks $A_1$ and $A_2$ at the second level. Similarly, permutation (1,3,2,4) transforms $(x_1,x_2,x_3,x_4)$ into $(x_3,x_4,x_2,x_1)$ ($3\to1, 2\to3, 4\to2, 1\to4$), in effect swapping elements inside the second block at the first level and swapping $A_1$ and $A_2$ at the second level.

In this embodiment, Equation (1) automatically selects only that permutations that: i) permute elements only in the first block (such as (1,2)); ii) permute elements only in the second block (such as (3,4)); permute elements in the first block and in the second block in a similar manner (such as (1,2)(3,4)); swap whole blocks (such as (1,3)(2,4)); swap entire blocks and permute elements inside both blocks (such as (1,4)(2,3)), swap entire blocks and permute elements inside the first block (such as (1,4,2,3)); or swap entire blocks and permute elements inside the second block (such as (1,3,2,4)).

Table 1 illustrates this example for all possible values of input vector $\underline{x}$ of the four-input, two-state q-module. The first four columns identify all possible input states identified by 4-tuple input vector $\underline{x}$, which represents inputs that may be received by the q-module. The fifth column identifies whether a test procedure is required to verify the output produced by function $f(\underline{x})$, which defines the expected operation of the q-module, for each possible value of input vector $\underline{x}$. Permutations of previously verified vectors $\underline{x}$ that do not need to be tested are identified by the term "NOTEST."

TABLE 1

| x1 | x2 | x3 | x4 | $f_2$(x1, x2, x3, x4) |
|---|---|---|---|---|
| 0 | 0 | 0 | 0 | TEST |
| 0 | 0 | 0 | 1 | TEST |
| 0 | 0 | 1 | 0 | NOTEST |
| 0 | 0 | 1 | 1 | TEST |
| 0 | 1 | 0 | 0 | NOTEST |
| 0 | 1 | 0 | 1 | TEST |
| 0 | 1 | 1 | 0 | NOTEST |
| 0 | 1 | 1 | 1 | TEST |
| 1 | 0 | 0 | 0 | NOTEST |
| 1 | 0 | 0 | 1 | NOTEST |
| 1 | 0 | 1 | 0 | NOTEST |
| 1 | 0 | 1 | 1 | NOTEST |
| 1 | 1 | 0 | 0 | NOTEST |
| 1 | 1 | 0 | 1 | NOTEST |
| 1 | 1 | 1 | 0 | NOTEST |
| 1 | 1 | 1 | 1 | TEST |

For example, once input vector (0,1,0,1) has been verified, there is no need to test the following permutations:

(0,1,0,1): the trivial permutation(id),
(1,0,0,1): permutation (1,2): swap $x_1$ with $x_2$,
(0,1,1,0): permutation (3,4): swap $x_3$ with $x_4$,
(1,0,1,0): permutation (1,2)(3,4): swap $x_1$ with $x_2$ and swap $x_3$ with $x_4$,
(0,1,0,1): permutation (1,3)(2,4): swap block $(x_1,x_2)$ with block $(x_3,x_4)$,
(1,0,1,0): permutation (1,4)(2,3): swap block $(x_1,x_2)$ with block $(x_3,x_4)$ and swap $x_1$ with $x_2$ and swap $x_3$ with $x_4$,
(0,1,1,0): permutation (1,3,2,4): swap block $(x_1,x_2)$ with block $(x_3,x_4)$ and swap x1 with x2. As described in previous examples, this permutation performs the following procedure:

replace index #1 of x with $x_3$ (index #3 of x)$\to(x_3, x_2, x_3, x_4)$,
replace index #3 of x with $x_2$ (index #2 of x)$\to(x_3, x_2, x_2, x_4)$,
replace index #2 of x with $x_4$ (index #4 of x)$\to(x_3, x_4, x_2, x_4)$, replace index #4 of x with $x_1$ (index #1 of x)→($x_3$, $x_4$, $x_2$, $x_1$), stop because rotating back to the first index of σ would repeat a previously performed operation.

(1,0,0,1): permutation (1,4,2,3): swap block ($x_1$,$x_2$) with block ($x_3$,$x_4$) and swap x3. This permutation performs the following procedure:

replace index #1 of x with $x_4$ (index #4 of x)→($x_4$, $x_2$, $x_3$, $x_4$), replace index #4 of x with $x_2$ (index #2 of x)→($x_4$, $x_2$, $x_3$, $x_2$), replace index #2 of x with $x_3$ (index #3 of x)→($x_4$, $x_3$, $x_3$, $x_2$), replace index #3 of x with $x_1$ (index #1 of x)→($x_4$, $x_3$, $x_1$, $x_2$), stop because rotating back to the first index of σ would repeat a previously performed operation.

Deleting duplicate input vectors produces a set of input vectors {(0101), (0110), (1001), (1010)} that may be produced from each other by applying invariant permutations of S(f) to vector (0101). Once (0101) has been verified, no subsequent vectors in the table need be tested. Table 1 illustrates this by noting that (0110), (1001), (1010), all of which follow (0101) in the test sequence, do not need to be tested. Applying these invariant permutations upon other input vectors of Table 1 will similarly eliminate the need to test other input vectors.

In a similar manner, an invariance group may be used to reduce the total number of tests required to completely verify other types of q-modules. In the above 4-input, 1-output-state example, the total number of tests is reduced from 16 to 6, but when the number of inputs or the number of possible input states of a q-module increases, embodiments of the present invention may allow very large numbers of tests to be eliminated.

What is claimed is:

1. A quantum-logic test-development system comprising a processor, a memory coupled to the processor, and a computer-readable hardware storage device coupled to the processor, the storage device containing program code configured to be run by the processor via the memory to implement a method for optimizing testing of a partially symmetric quantum-logic circuit by using wreath products and invariance groups, the method comprising:

the system receiving architectural information about a quantum-logic circuit capable of being represented by a function (f);

the system evenly dividing a set of inputs of the circuit into a set of non-intersecting first-level blocks, where every first-level block contains a same number of inputs;

the system evenly partitioning the set of first-level blocks into a set of non-intersecting second-level blocks, where every second-level block contains a same number of first-level blocks;

the system creating a first-level group G1 that comprises a set of first-level indices and a set of one or more first-level permutation operations capable of being performed upon the set of first-level indices;

the system defining a second-level group G2 that comprises a set of second-level indices and a set of one or more second-level permutation operations capable of being performed upon the set of second-level indices, where a number of the set of second-level indices equals the number of first-level blocks in each second-level block; and the system generating a first wreath product G1 ≀ G2 as a function of the evenly dividing and the evenly partitioning, where ≀ is an unrestricted wreath-product operator, and where the first wreath product represents a first invariance group of the function f( ).

2. The system of claim 1, where the first invariance group comprises a set of invariant permutations that each identify a permutation of at least two inputs of the set of inputs, and where no output of the quantum-logic circuit changes state when the quantum-logic circuit receives a permuted input vector generated by performing a permutation of the set of invariant permutations upon the circuit's most recent input vector.

3. The system of claim 2, further comprising:

the system optimizing a procedure for testing the quantum-logic circuit, where the procedure comprises a series of tests that each verify correct operation of the quantum-logic circuit in response to receiving a distinct input vector of a set of input vectors, and where the optimizing comprises deleting from the series of tests any test that would attempt to verify correct operation of the quantum-logic circuit in response to receiving a permuted input vector generated by performing a permutation of the set of invariant permutations upon an input vector already verified by another test of the series of tests.

4. The system of claim 1, where the quantum-circuit has at least sixteen inputs divided into at least eight non-intersecting first-level blocks and at least four non-intersecting second-level blocks, the method further comprising:

the system evenly apportioning, as a function of the architectural information, the at least four second-level blocks into at least two non-intersecting third-level blocks, where every third-level block contains a same number of second-level blocks;

the system identifying a third-level group G3 that comprises a set of third-level indices and a set of one or more third-level permutation operations capable of being performed upon the set of third-level indices, where a number of the set of third-level indices equals the number of second-level blocks in each third-level block; and the system generating a second wreath product (G1 ≀ G2) ≀ G3, where the second wreath product represents a second invariance group of the function f( ), where the second invariance group comprises a second set of invariant permutations that each identify a permutation of at least two inputs of the at least sixteen inputs, and where no output of the quantum-logic circuit changes state when the quantum-logic circuit receives a permuted input vector generated by performing a permutation of the second set of invariant permutations upon the circuit's most recent input vector.

5. The system of claim 1, where the first wreath product equals the group $((G_1 \times \ldots G_m) \times H, X \times Y)$, where × is a Cartesian product operator, where m=the number of first-level blocks contained in each second-level block, where each group $G_1 \ldots G_m$ is an identical copy of the set of first-level indices, where H=the set of second-level indices, where X=the set of first-level permutation operations, and where Y=the set of second-level permutation operations.

6. The system of claim 4,
where the first wreath product equals the group $((G_1 \times \ldots \times G_m) \times H, X \times Y)$,
where × is a Cartesian product operator,
where m=the number of first-level blocks contained in each second-level block,
where each group $G_1 \ldots G_m$ is an identical copy of the set of first-level indices,
where H=the set of second-level indices,
where X=the set of first-level permutation operations,
where Y=the set of second-level permutation operations,
where the second wreath product equals the group $((H_1 \times \ldots \times H_p) \times L, X \times Y \times Z) = (((G_1 \times G_2 \ldots \times G_m) \times H) \times ((G_{m+1} \times G_{m+2} \ldots \times G_{2m}) \times H_2 \ldots \times ((G_{(p-1)m+1} \times G_{(p-1)m+2} \ldots \times G_{pm}) \times H_p)) \times L, X \times Y \times Z)$,
where p=the number of second-level blocks contained in each third-level block,
where each group $H_1 \ldots H_p$ is an identical copy of the set of second-level indices,
where L=the set of third-level indices, and
where Z=the set of third-level permutation operations.

7. The system of claim 1, where the received architectural information identifies a number of inputs of the circuit, a number of outputs of the circuit, a number of states that may be assumed by each input of the circuit, and a number of states that may be assumed by each output of the circuit.

8. The system of claim 3, further comprising:
the system directing a test apparatus to perform the series of tests upon the quantum-logic circuit, where the series of tests are selected as a function of the optimized procedure for testing the circuit.

9. A method for optimizing testing of a partially symmetric quantum-logic circuit by using wreath products and invariance groups, the method comprising:
receiving architectural information about a quantum-logic circuit capable of being represented by a function f( );
evenly dividing a set of inputs of the circuit into a set of non-intersecting first-level blocks, where every first-level block contains a same number of inputs;
evenly partitioning the set of first-level blocks into a set of non-intersecting second-level blocks, where every second-level block contains a same number of first-level blocks;
creating a first-level group G1 that comprises a set of first-level indices and a set of one or more first-level permutation operations capable of being performed upon the set of first-level indices;
defining a second-level group G2 that comprises a set of second-level indices and a set of one or more second-level permutation operations capable of being performed upon the set of second-level indices, where a number of the set of second-level indices equals the number of first-level blocks in each second-level block; and
generating a first wreath product G1 ≀ G2 as a function of the evenly dividing and the evenly partitioning, where ≀ is an unrestricted wreath-product operator, and where the first wreath product represents a first invariance group of the function f( ).

10. The method of claim 9,
where the first invariance group comprises a set of invariant permutations that each identify a permutation of at least two inputs of the set of inputs, and
where no output of the quantum-logic circuit changes state when the quantum-logic circuit receives a permuted input vector generated by performing a permutation of the set of invariant permutations upon the circuit's most recent input vector.

11. The method of claim 10, further comprising:
the system optimizing a procedure for testing the quantum-logic circuit,
where the procedure comprises a series of tests that each verify correct operation of the quantum-logic circuit in response to receiving a distinct input vector of a set of input vectors, and
where the optimizing comprises deleting from the series of tests any test that would attempt to verify correct operation of the quantum-logic circuit in response to receiving a permuted input vector generated by performing a permutation of the set of invariant permutations upon an input vector already verified by another test of the series of tests.

12. The method of claim 9, where the quantum-circuit has at least sixteen inputs divided into at least eight non-intersecting first-level blocks and at least four non-intersecting second-level blocks, the method further comprising
evenly apportioning, as a function of the architectural information, all the at least four second-level blocks into at least two non-intersecting third-level blocks, where every third-level block contains a same number of second-level blocks;
identifying a third-level group G3 that comprises a set of third-level indices and a set of one or more third-level permutation operations capable of being performed upon the set of third-level indices, where a number of the set of third-level indices equals the number of second-level blocks in each third-level block; and
generating a second wreath product (G1 ≀ G2) ≀ G3, where the second wreath product represents a second invariance group of the function f( ),
where the second invariance group comprises a second set of invariant permutations that each identify a permutation of at least two inputs of the at least sixteen inputs, and
where no output of the quantum-logic circuit changes state when the quantum-logic circuit receives a permuted input vector generated by performing a permutation of the second set of invariant permutations upon the circuit's most recent input vector.

13. The method of claim 9,
where the first wreath product equals the group $((G_1 \times \ldots G_m) \times H, X \times Y)$,
where × is a Cartesian product operator,
where m=the number of first-level blocks contained in each second-level block,
where each group $G_1 \ldots G_m$ is an identical copy of the set of first-level indices,
where H=the set of second-level indices,
where X=the set of first-level permutation operations, and
where Y=the set of second-level permutation operations.

14. The method of claim 12,
where the first wreath product equals the group $((G_1 \times \ldots G_m) \times H, X \times Y)$,
where × is a Cartesian product operator,
where m=the number of first-level blocks contained in each second-level block,
where each group $G_1 \ldots G_m$ is an identical copy of the set of first-level indices,
where H=the set of second-level indices,
where X=the set of first-level permutation operations,
where Y=the set of second-level permutation operations, where the second wreath product equals the group $((H_1 \times \ldots \times H_p) \times L, X \times Y \times Z) = (((G_1 \times G_2 \ldots \times G_m) \times H_1) \times ((G_{m+1} \times G_{m+2} \ldots \times G_{2m}) \times H_2 \ldots \times ((G_{(p-1)m+1} \times G_{(p-1)m+2} \ldots \times G_{pm}) \times H_p)) \times L, X \times Y \times Z)$, where p=the number of second-level blocks contained in each third-level block, where each group $H_1 \ldots H_p$ is an identical copy of the set of second-level indices, where L=the set of third-level indices, and where Z=the set of third-level permutation operations.

15. The method of claim 9, further comprising providing at least one support service for at least one of creating, integrating, hosting, maintaining, and deploying computer-readable program code in the computer system, wherein the computer-readable program code in combination with the computer system is configured to implement the receiving, the evenly dividing, the evenly partitioning, the creating, the defining, and the generating.

16. A computer program product, comprising a computer-readable hardware storage device having a computer-readable program code stored therein, the program code configured to be executed by a quantum-logic test-development system comprising a processor, a memory coupled to the processor, and a computer-readable hardware storage device coupled to the processor, the storage device containing program code configured to be run by the processor via the memory to implement a method for optimizing testing of a partially symmetric quantum-logic circuit by using wreath products and invariance groups, the method comprising:

the system receiving architectural information about a quantum-logic circuit capable of being represented by a function f( );

the system evenly dividing a set of inputs of the circuit into a set of non-intersecting first-level blocks, where every first-level block contains a same number of inputs;

the system evenly partitioning the set of first-level blocks into a set of non-intersecting second-level blocks, where every second-level block contains a same number of first-level blocks;

the system creating a first-level group G1 that comprises a set of first-level indices and a set of one or more first-level permutation operations capable of being performed upon the set of first-level indices;

the system defining a second-level group G2 that comprises a set of second-level indices and a set of one or more second-level permutation operations capable of being performed upon the set of second-level indices, where a number of the set of second-level indices equals the number of first-level blocks in each second-level block; and the system generating a first wreath product G1 ≀ G2 as a function of the evenly dividing and the evenly partitioning, where ≀ is an unrestricted wreath-product operator, and where the first wreath product is a first invariance group of the function f( ), where the first wreath product equals the group $((G_1 \times \ldots G_m) \times H, X \times Y)$, where × is a Cartesian product operator, where m=the number of first-level blocks contained in each second-level block, where each group $G_1 \ldots G_m$ is an identical copy of the set of first-level indices, where H=the set of second-level indices, where X=the set of first-level permutation operations, and where Y=the set of second-level permutation operations.

17. The computer program product of claim 16, where the first invariance group comprises a set of invariant permutations that each identify a permutation of at least two inputs of the set of inputs, and where no output of the quantum-logic circuit changes state when the quantum-logic circuit receives a permuted input vector generated by performing a permutation of the set of invariant permutations upon the circuit's most recent input vector.

18. The computer program product of claim 16, further comprising:

the system optimizing a procedure for testing the quantum-logic circuit, where the procedure comprises a series of tests that each verify correct operation of the quantum-logic circuit in response to receiving a distinct input vector of a set of input vectors, and where the optimizing comprises deleting from the series of tests any test that would attempt to verify correct operation of the quantum-logic circuit in response to receiving a permuted input vector generated by performing a permutation of the set of invariant permutations upon an input vector already verified by another test of the series of tests.

19. The computer program product of claim 16, where the quantum-circuit has at least sixteen inputs divided into at least eight non-intersecting first-level blocks and at least four non-intersecting second-level blocks, the method further comprising:

the system evenly apportioning, as a function of the architectural information, all the at least four second-level blocks into at least two non-intersecting third-level blocks, where every third-level block contains a same number of second-level blocks;

the system identifying a third-level group G3 that comprises a set of third-level indices and a set of one or more third-level permutation operations capable of being performed upon the set of third-level indices, where a number of the set of third-level indices equals the number of second-level blocks in each third-level block; and the system generating a second wreath product (G1 ≀ G2) ≀ G3, where the second wreath product represents a second invariance group of the function f( ), where the second invariance group comprises a second set of invariant permutations that each identify a permutation of at least two inputs of the at least sixteen inputs, and where no output of the quantum-logic circuit changes state when the quantum-logic circuit receives a permuted input vector generated by performing a permutation of the second set of invariant permutations upon the circuit's most recent input vector.

20. The computer program product of claim 19, where the second wreath product equals the group $((H_1 \times \ldots \times H_p) \times L, X \times Y \times Z) = (((G_1 \times G_2 \ldots \times G_m) \times H_1) \times ((G_{m+1} \times G_{m+2} \ldots \times G_{2m}) \times H_2 \ldots \times ((G_{(p-1)m+1} \times G_{(p-1)m+2} \ldots \times G_{pm}) \times H_p)) \times L, X \times Y \times Z)$, where p=the number of second-level blocks contained in each third-level block,
where each group $H_1 \ldots H_p$ is an identical copy of the set of second-level indices,
where L=the set of third-level indices, and
where Z=the set of third-level permutation operations.

\* \* \* \* \*